(12) United States Patent
Kim et al.

(10) Patent No.: US 9,992,877 B2
(45) Date of Patent: Jun. 5, 2018

(54) MANUFACTURING METHOD FOR A LIGHTING APPARATUS FOR A VEHICLE

(71) Applicants: Hyundai Motor Company, Seoul (KR); Kia Motors Corporation, Seoul (KR); Hyundai Mobis Co., Ltd., Seoul (KR)

(72) Inventors: Jaehong Kim, Suwon-si (KR); Young Sub Oh, Suwon-si (KR); Bock Cheol Lee, Suwon-si (KR); Dong Gon Kang, Suwon-si (KR)

(73) Assignees: Hyundai Motor Company, Seoul (KR); Kia Motors Corporation, Seoul (KR); Hyundai Mobis Co., Ltd., Seoul (KR)

( * ) Notice: Subject to any disclaimer, the term of this patent is extended or adjusted under 35 U.S.C. 154(b) by 248 days.

(21) Appl. No.: 14/923,143

(22) Filed: Oct. 26, 2015

(65) Prior Publication Data
US 2016/0044793 A1 Feb. 11, 2016

Related U.S. Application Data

(62) Division of application No. 14/015,590, filed on Aug. 30, 2013, now abandoned.

(30) Foreign Application Priority Data

Aug. 30, 2012 (KR) ........................ 10-2012-0095826

(51) Int. Cl.
*H05K 3/30* (2006.01)
*H05K 3/28* (2006.01)
*F21S 8/10* (2006.01)

(52) U.S. Cl.
CPC ............ *H05K 3/284* (2013.01); *F21S 48/212* (2013.01); *F21S 48/215* (2013.01); *F21S 48/2212* (2013.01); *H05K 3/305* (2013.01); *H05K 2203/1305* (2013.01); *Y10T 29/4913* (2015.01)

(58) Field of Classification Search
CPC .... F21S 48/212; F21S 48/215; F21S 48/2212; H05K 3/284; H05K 3/305
See application file for complete search history.

(56) References Cited

U.S. PATENT DOCUMENTS

| | | |
|---|---|---|
| 4,480,293 A | 10/1984 | Wells |
| 5,128,843 A | 7/1992 | Guritz |
| 6,977,055 B2 | 12/2005 | Gallant et al. |

(Continued)

FOREIGN PATENT DOCUMENTS

| | | |
|---|---|---|
| JP | 2000-156525 A | 6/2000 |
| JP | 2005-136224 A | 5/2005 |

(Continued)

*Primary Examiner* — Paul D Kim
(74) *Attorney, Agent, or Firm* — Morgan, Lewis & Bockius LLP

(57) ABSTRACT

A lighting apparatus for a vehicle may include a flexible printed circuit board of which at least one lighting source may be mounted on an upper surface of the flexible printed circuit board, and a cover which may be made of flexible material, and connected on the printed circuit board for the at least one lighting source to be disposed within the cover, wherein the cover distributes a light emitted from the at least one lighting source to an upper direction of the cover.

9 Claims, 5 Drawing Sheets

(56) References Cited

U.S. PATENT DOCUMENTS

| | | | |
|---|---|---|---|
| 7,006,879 B2 * | 2/2006 | Ishizaka | H05K 3/0008 408/16 |
| 7,635,202 B2 | 12/2009 | Awabayashi | |
| 9,011,980 B1 * | 4/2015 | Beaulieu | B32B 27/08 427/243 |
| 2007/0053179 A1 | 3/2007 | Pang et al. | |
| 2009/0207339 A1 | 8/2009 | Ajichi et al. | |
| 2009/0296389 A1 | 12/2009 | Hsu | |
| 2010/0065873 A1 | 3/2010 | Bhattacharya et al. | |
| 2011/0001152 A1 | 1/2011 | Chung et al. | |
| 2011/0006318 A1 | 1/2011 | Chung | |
| 2011/0051412 A1 | 3/2011 | Jeong et al. | |
| 2011/0089441 A1 | 4/2011 | Wu | |
| 2011/0095318 A1 | 4/2011 | Liao | |
| 2011/0095319 A1 | 4/2011 | Kim | |
| 2011/0175512 A1 | 7/2011 | Lai | |
| 2011/0186894 A1 | 8/2011 | Kim | |

FOREIGN PATENT DOCUMENTS

| | | |
|---|---|---|
| JP | 2007-73968 A | 3/2007 |
| JP | 2007-234968 A | 9/2007 |
| JP | 2008-227456 A | 9/2008 |
| KR | 10-2007-0098100 A | 10/2007 |
| KR | 10-0786361 B1 | 12/2007 |
| KR | 10-0821684 B1 | 4/2008 |

* cited by examiner

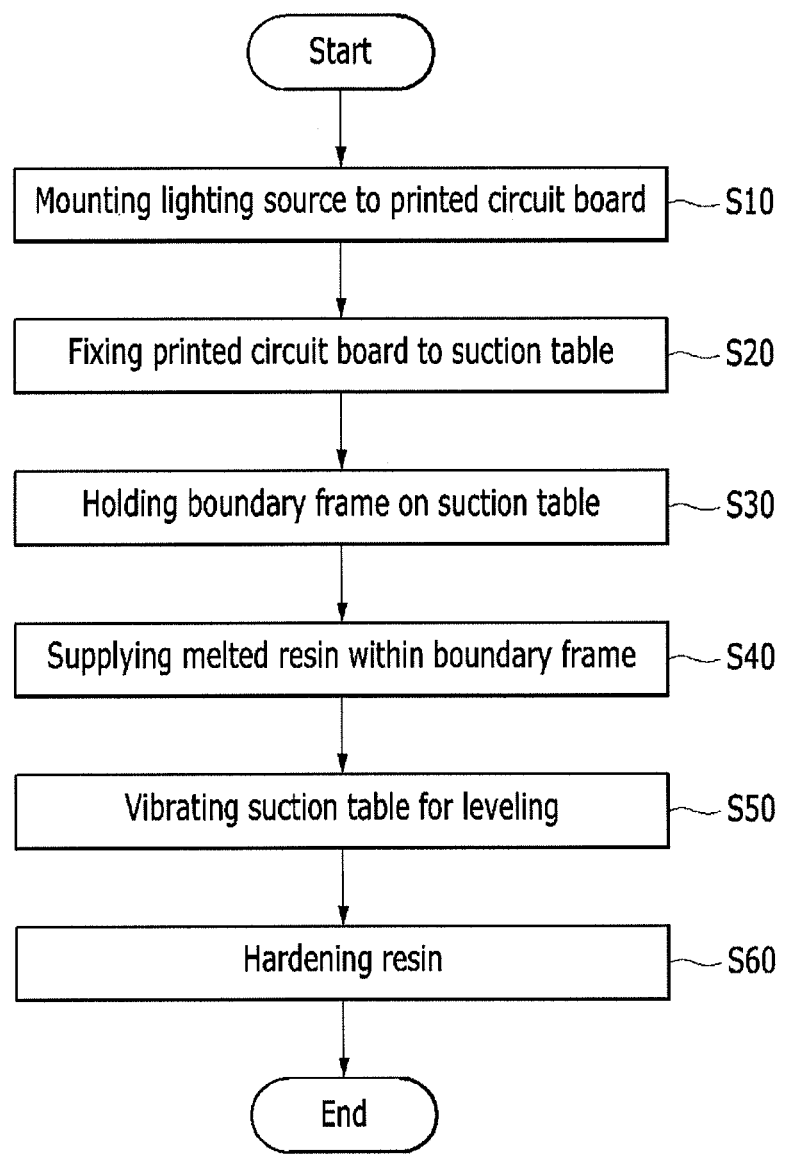

MANUFACTURING METHOD FOR A LIGHTING APPARATUS FOR A VEHICLE

CROSS-REFERENCE TO RELATED APPLICATION

The present application is a Divisional of U.S. patent application Ser. No. 14/015,590 filed Aug. 30, 2013, now abandoned, which claims priority to Korean Patent Applications No. 10-2012-0095826 filed on Aug. 30, 2012, the entire contents of which is incorporated herein for all purposes by these references.

BACKGROUND OF THE INVENTION

Field of the Invention

The present invention relates to a lighting apparatus for a vehicle and a manufacturing method for the same. More particularly, the present invention relates to a flexible lighting apparatus for a vehicle and a manufacturing method for the same.

Description of Related Art

Generally, a vehicle is provided with various lighting apparatus to a front and rear side of the vehicle for offering safety and driving convenience and the lighting apparatus is a headlight, a tailing, a turn signal lamp and so on.

The lighting apparatus includes at least one lighting source for emitting light, and recently an LED (Light Emitting Diode), having enhanced luminance efficiency, is widely used as the lighting source. Thus, a lighting apparatus including an LED as lighting source has been developed.

The lighting apparatus having the LED as the lighting source basically includes a PCB (Printed Circuit Board) for mounting the LED, a heat sink mounted to the PCB for radiating heat of the LED, and a lens for distributing the light of the LED to the outside.

Also, the lighting apparatus having the LED as the lighting source may further include a reflector for reflecting the light emitted from the LED, a shield for shutting out a part of the light emitting from the LED or a part of the light reflected by the reflector, a light guide for total reflection of the light emitted from the LED.

However, generally, the LED is disposed outside of the light guide and the emitted light from the LED is laminated into the light guide. So, when the light emitted from the LED passes into the light guide though air, optical loss or optical attenuation may happen so that luminance efficiency may be deteriorated.

Recently, some countries employ a DRL (Daytime Running Lighting) for a vehicle, and intensive interesting in design of vehicle causes various contoured or bent surfaces of a vehicle.

However, a general lighting apparatus is formed with hardened elements and design of a vehicle is various and thus various design of a lighting apparatus are required for responding the various vehicle design.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a lighting apparatus for a vehicle and a manufacturing method for the same having advantages of flexibility responding to a mounting portion of a vehicle for the lighting apparatus.

In an aspect of the present invention, a lighting apparatus for a vehicle may include a flexible printed circuit board of which at least one lighting source is mounted on an upper surface of the flexible printed circuit board, and a cover which is made of flexible material, and connected on the printed circuit board for the at least one lighting source to be disposed within the cover, wherein the cover distributes a light emitted from the at least one lighting source to an upper direction of the cover.

The lighting apparatus further may include a reflective portion adhering to the upper surface of the printed circuit board between the printed circuit board and the cover for reflecting the light emitted from the at least one lighting source to distribute the light through the cover.

The cover is made of transparent material.

The cover is formed by UV (Ultraviolet) resin.

A lighting surface is formed to a side of the at least one lighting source.

The at least one lighting source is plural, and the plurality of lighting sources may include a first lighting source and a second lighting source of which each lighting surface faces each other.

The at least one lighting source is plural, wherein the plurality of lighting sources may include a first lighting source and a second lighting source which are disposed apart from each other and of which each lighting surface faces the same direction, and a third lighting source of which a lighting surface faces toward between the first lighting source and the second lighting source, wherein the first lighting source, the third lighting source and the second lighting sources are arranged alternatively along the flexible printed circuit board.

The at least one lighting source is a LED (Light Emitting Diode).

The cover closely contacts to the printed circuit board.

In another aspect of the present invention, a manufacturing method for a lighting apparatus for a vehicle may include mounting at least one lighting source to a flexible printed circuit board of which a reflective portion is adhesive to an upper surface of the flexible printed circuit board, fixing the printed circuit board to a suction table, holding a boundary frame on the suction table for the printed circuit board inserted therein, supplying melted resin within the boundary frame for the at least one lighting source to be immersed within the resin, and hardening the resin.

The suction table is connected to a vacuum device and an inside pressure of the suction table is selectively lowered by operation of the vacuum device, wherein a suction hole is formed to the suction table, and wherein the printed circuit board is fixed to the suction table through the suction hole by a negative pressure within the suction table.

The manufacturing method further may include vibrating the suction table for leveling of the melted resin after immersing the at least one lighting source within the resin.

The cover is made of transparent material.

The cover is formed by UV (Ultraviolet) resin.

The hardening the resin is executed by the lighting apparatus passing through a UV hardening device.

A lighting surface is formed to a side of the at least one lighting source.

The at least one lighting source is plural, wherein the plurality of lighting sources may include a first lighting source and a second lighting source of which each lighting surface faces each other.

The at least one lighting source is plural, wherein the plurality of lighting sources may include a first lighting source and a second lighting source which are disposed apart from each other and of which each lighting surface faces the same direction, a third lighting source of which a lighting surface faces toward between the first lighting source and the second lighting source, and wherein the first lighting source, the third lighting source and the second lighting sources are arranged alternatively along the flexible printed circuit board.

The at least one lighting source is a LED (Light Emitting Diode).

According to the lighting apparatus and the manufacturing method for the same of an exemplary embodiment of the present invention, the lighting apparatus may be easily mounted to a vehicle without regard to shape of a mounting portion to match the design of a vehicle with flexibility.

For using FPCB (Flexible Printed Circuit Board) with light weight and flexibility, weight of a vehicle may also be reduced.

For the lighting source is disposed within the cover, thus luminance efficiency may be enhanced comparing a general lighting apparatus which is disposed outside of a cover. Thus the lighting apparatus according to an exemplary embodiment of the present invention may be widely used as various lighting apparatus as a stop lamp, a turn signal lamp and so on.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 5 is a flowchart of a manufacturing method for a lighting apparatus according to an exemplary embodiment of the present invention.

Figure 1:
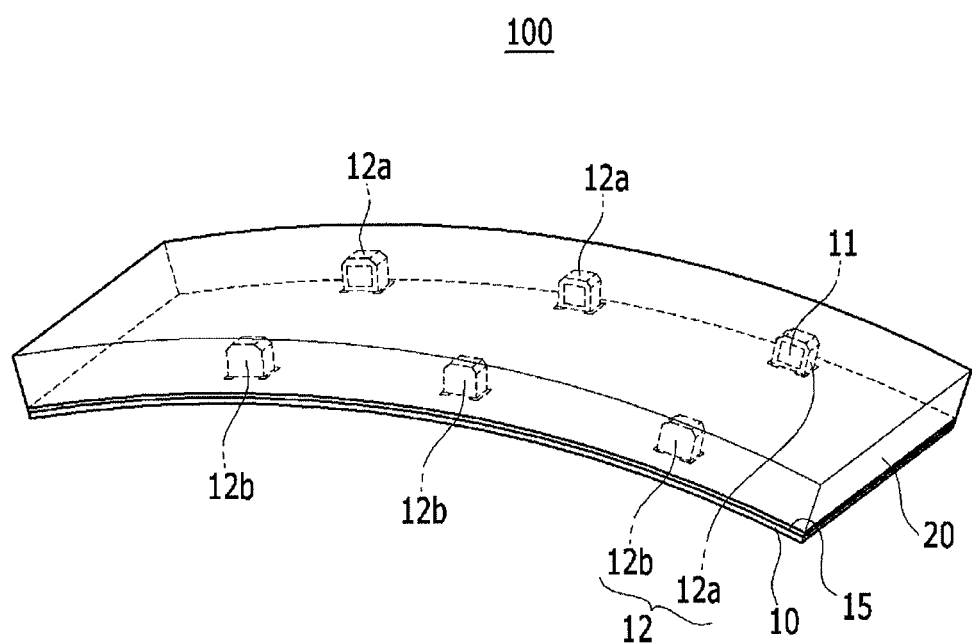
FIG. 1 is a drawing showing a lighting apparatus for a vehicle according to a first exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims. The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, like reference numerals represent the same constituent elements.

Exemplary embodiments of the present invention will hereinafter be described in detail with reference to the accompanying drawings.

FIG. 1 is a drawing showing a lighting apparatus for a vehicle according to a first exemplary embodiment of the present invention.

Referring to FIG. 1, a lighting apparatus 100 according to the first exemplary embodiment of the present invention includes a flexible printed circuit board (FPCB) 10 and a cover 20 made of flexible material and disposed on the printed circuit board 10.

At an upper surface of the printed circuit board 10, at least one lighting source 12 is mounted thereto. The lighting source 12 may be an LED (Light Emitting Diode) and a lighting surface 11 is formed to a side of the lighting source 12.

In the present exemplary embodiment, two lighting source 12a and 12b, as the first lighting source 12a and the second lighting source 12b as a set are disposed on the upper surface of the printed circuit board 10 of which each lighting surface 11 faces each other.

In the drawing, on the upper surface of the printed circuit board 10, 3 sets of the first lighting source 12a and the second lighting source 12b are disposed facing of which each lighting surface 11 faces each other, but is not limited thereto.

Hereinafter, at least one lighting source 12 will be denoted as the lighting source 12 for convenience description.

A reflective portion 15 for reflecting the light emitted from lighting source 12 is disposed on the upper surface of the printed circuit board 10. Patterns for reflecting emitted from lighting source 12 may be printed on the upper surface of the reflective portion 15, and the reflective portion 15 may be thin film and adhered to the upper surface of the printed circuit board 10.

Since the reflective portion 15 is adhered to the upper surface of the printed circuit board 10, a shield element for shutting out light passing to the other surface of the reflective portion 15 may not be required.

The lighting source 12 is electrically connected to the printed circuit board 10 through the reflective portion 15 and protrudes from the reflective portion 15.

Since the lighting surfaces 11 of the first lighting source 12a and the second lighting source 12b are faced each other, the intensity of radiation reflected by the reflective portion 15 may sufficiently be secured.

The lighting source 12 is immersed within the cover 20 and disposed within the cover 20. That is, the cover 20 closely contacts the reflective portion 15 and is disposed on the printed circuit board 10, and distributes the light reflected by the reflective portion 15 through the upper portion thereof.

The cover 20 is made of transparent material for distributing the light reflected by the reflective portion 15.

The cover 20 may be formed by resin, for example plastic material, is supplied on the reflective portion 15 of the printed circuit board 10 as melted state, and is hardened. And thus the lighting source 12 is immersed within the cover 20 and the cover 20 is connected with the printed circuit board 10.

Since the lighting source 12 is disposed within the cover 20 not outside of the cover 20 and the light emitted from lighting source 12 does not pass through air, thus the light may be prevented from being disappeared due to total reflection and also luminance efficiency may be improved.

Also, since air space does not exist between the lighting source 12 and the cover 20, medium the light passing though is reduced and incidence rate of the light to the cover 20 (transmissivity) may be improved.

The cover 20 may be formed by UV (Ultraviolet) resin. Refractive index of the UV resin is higher than that of the air, and also thermal conduction rate of the UV resin is higher than that of the air. In the present exemplary embodiment, when the air is reference media (refractive index=1), the refractive index of the LED as the lighting source 12 is about 3, and the refractive index of the UV resin is about 1.5.

If the lighting source 12 is disposed outside of the cover 20, refractive index difference between the lighting source 12 and the air is about 2. In this case, the critical angle for total internal reflection is about 33.9 degree.

However, in the present exemplary embodiment, since the lighting source 12 is disposed within the cover 20, refractive index difference between the lighting source 12 and the UV resin is about 1.5. In this case, the critical angle for total internal reflection is about 52.4 degree, and thus luminance efficiency may be improved.

In general, a heat sink for radiating heat of the LED is required. However, in the present exemplary embodiment, since thermal conduction rate of the UV resin is higher than that of the air, a separate heat sink is not required.

Also, melting temperature of the UV resin is relative low enough to immerse the lighting source 12 within the UV resin. That is, a general light guide functioning as the cover 20 is made of material injected with relatively high temperature. When the cover 20 is made of the material same as the general light guide and the lighting source 12 is immersed within the cover 20, then the lighting source 12 may be damaged by the cover 20 with relative high temperature. So, in the exemplary embodiment of the present invention, the cover 20 is made of the UV resin with relatively low melting temperature to immerse the lighting source 12 therewithin.

The UV resin may be made of acrylic material with excellent light transmitting characteristic for improving luminance efficiency. For example, in the exemplary embodiment of the present invention, the cover 20 is made of acrylic UV resin with composition ratio as (a) Urethane acrylate 20-60 wt %, (b) lobornyl acrylate 20-60 wt %, (c) 2-Hydroxyproyl acrylate 10-40 wt %, (d) 2-Hydroxyethyl methacrylate 9-20 wt %, (e) additive 1-3 wt % per total weight.

In the first exemplary embodiment of the present invention, the printed circuit board 10 and the cover 20 of the lighting apparatus 100 are made of flexible material, so that the lighting apparatus 100 may be bent to match to a rounded surface of a vehicle. The lighting apparatus 100 according to the first exemplary embodiment of the present invention is bent in FIG. 1. However, the lighting apparatus 100 may be flat as shown in FIG. 2 then the lighting apparatus 100 may be bent to match with a rounded surface of a vehicle to be mounted thereto.

Figure 2:
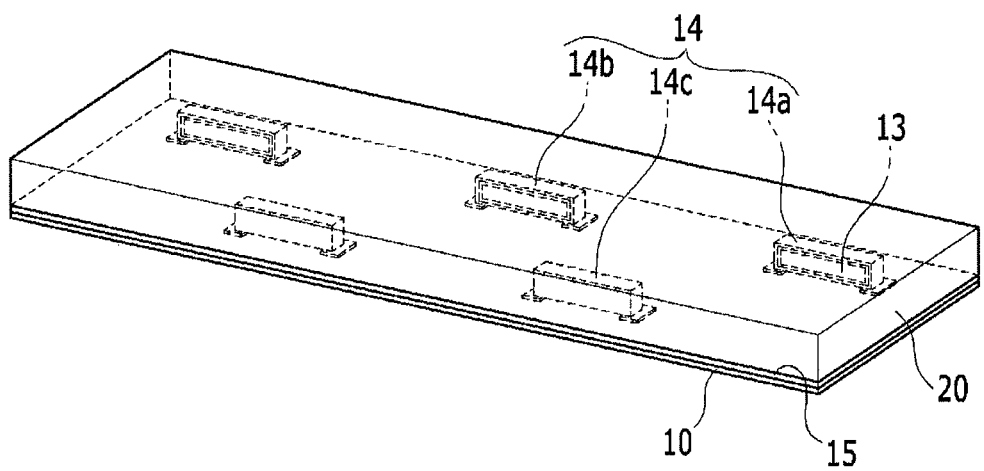
FIG. 2 is a drawing showing a lighting apparatus for a vehicle according to a various exemplary embodiments of the present invention.

FIG. 2 is a drawing showing a lighting apparatus for a vehicle according to a second exemplary embodiment of the present invention. In describing the second exemplary embodiment of the present invention, like reference numerals of the first exemplary embodiment represent the same constituent elements and repeated description will be omitted.

In the first exemplary embodiment, the lighting source 12 includes the first lighting source 12a and the second lighting source 12b of which each lighting surface 11 faces each other. Referring to FIG. 2, however, in the second exemplary embodiment, a lighting source 14 of a lighting apparatus 200 includes a first lighting source 14a and a second lighting source 14b which are disposed apart from each other and of which each lighting surface 13 faces the same direction, and a third lighting source 14c of which a lighting surface faces toward between the first lighting source 14a and the second lighting source 14b.

According to the second exemplary embodiment of the present invention, the lighting surfaces 13 of each lighting source 14a, 14b, and 14c are disposed alternately, so that reduced numbers of the lighting source 14 may be disposed on the printed circuit board 10 comparing that of the first exemplary embodiment of the present invention.

And with the alternating disposition, the intensity of radiation reflected by the reflective portion 15 may sufficiently be secured.

For securing sufficient intensity of radiation, the lighting surfaces 13 of the lighting sources 14a, 14b, and 14c may be elongated.

The lighting apparatus 100 and 200 according to the exemplary embodiments of the present invention is required to reduce total thickness of the apparatus for securing flexibility.

Hereinafter, manufacturing methods for the lighting apparatus 100 and 200 according to the first and second exemplary embodiment of the present invention will be described. Since the manufacturing methods for the lighting apparatus 100 and 200 according to the first and second exemplary embodiment of the present are the same, so the identical, so the manufacturing method for the lighting apparatus 100 according to the first exemplary embodiment of the present invention will be described as an example.

Figure 3:
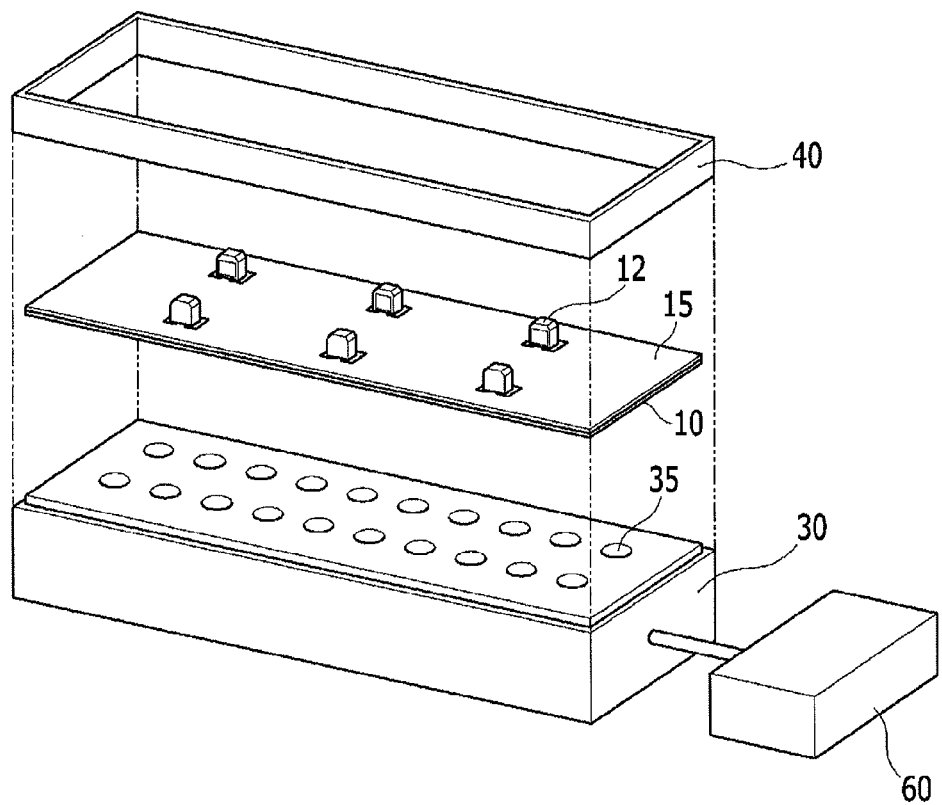
FIG. 3 and FIG. 4 are drawings showing a manufacturing method for a lighting apparatus according to an exemplary embodiment of the present invention.
Figure 4:
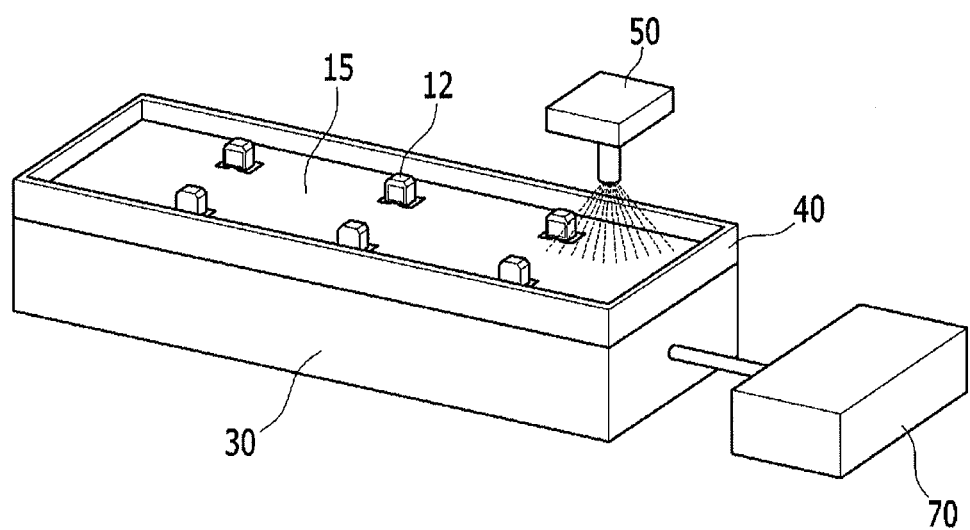

FIG. 3 and FIG. 4 are drawings showing a manufacturing method for a lighting apparatus according to an exemplary embodiment of the present invention and FIG. 5 is a flowchart of a manufacturing method for a lighting apparatus according to an exemplary embodiment of the present invention.

Referring to FIG. 3 to FIG. 5, a suction table 30 is disposed on a manufacturing line for fixing the flexible printed circuit board 10.

The suction table 30 is connected with a vacuum device 60 and negative pressure may be formed within the suction table 30 by the operation of the vacuum device 60.

A plurality of suction hole 35 is formed to the suction table 30, and the thin and flexible printed circuit board 10 may be fixed to the suction table 30 through the suction hole 35 using the negative pressure formed by the operation of the vacuum device 60.

If distance between each suction hole 35 is equal or less than 20 mm, low pressure difference may fix the printed circuit board 10 thereto without damage of the printed circuit board 10.

At the step S10, the lighting source 12 is mounted to the printed circuit board 10 made of flexible material where the reflective portion 15 is adhesive to the upper surface. The printed circuit board 10 may be cut at a predetermined size.

The printed circuit board 10 is disposed on the suction table 30 where the suction hole 35 is formed, then the vacuum device 60 is operated to fix the printed circuit board 10 on the suction table 30 through the suction hole 35 at the step S20.

Then, a boundary frame 40 is held to the suction table 30 for covering circumference of the printed circuit board 10 at the step S30.

Then melted resin is supplied within the boundary frame 40 though a resin supplier 50 for the lighting source 12 to be immersed within the resin at the step S40.

In this case, the melted resin is hardened to be the cover 20, and UV (Ultra Violet) resin may be used.

The melted resin requires leveling process for flatting upper surface. However, the melted resin is viscous, thus leveling with gravity consumes lots of time.

Thus, a vibrator 70 may be equipped for vibrating the suction table 30 to level the resin at the step S50 so that leveling process time may be reduced.

Then the resin is hardened at the step S60. In the present exemplary embodiment, since the resin may be formed by UV resin, the suction table 30 may be hardened passing through a hardening device. And the hardening device may be a UV hardening device.

The boundary frame 40 is removed from the suction table 30 and then manufacturing of the lighting apparatus 100 according to the first exemplary embodiment of the present invention is completed.

As described above, the lighting apparatus 100 and 200 according to the exemplary embodiments of the present is flexible, and is easily mounted to a vehicle without regard to shape of a mounting portion to match the design of a vehicle with flexibility.

For using the flexible printed circuit board with light weight and flexibility, weight of a vehicle may also be reduced.

For the lighting source is disposed within the cover, thus luminance efficiency may be enhanced comparing a general lighting apparatus which is disposed outside of a cover. Thus the lighting apparatus according to the exemplary embodiments of the present invention may be widely used as various lighting apparatus as a stop lamp, a turn signal lamp and so on.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A manufacturing method for a lighting apparatus for a vehicle comprising:
   mounting at least one lighting source to a flexible printed circuit board of which a reflective portion is adhesive to an upper surface of the flexible printed circuit board;
   fixing the printed circuit board to a suction table;
   holding a boundary frame on the suction table for the printed circuit board inserted therein;
   supplying melted resin within the boundary frame for the at least one lighting source to be immersed within the resin; and
   hardening the resin,
   wherein the at least one lighting source is plural,
   wherein the plurality of lighting sources includes:
      a first lighting source and a second lighting source which are disposed apart from each other and of which each lighting surface faces the same direction;
      a third lighting source of which a lighting surface faces toward between the first lighting source and the second lighting source, and
   wherein the first lighting source, the third lighting source and the second lighting sources are arranged alternatively along the flexible printed circuit board.

2. The manufacturing method of claim 1,
   wherein the suction table is connected to a vacuum device and an inside pressure of the suction table is selectively lowered by operation of the vacuum device;
   wherein a suction hole is formed to the suction table; and
   wherein the printed circuit board is fixed to the suction table through the suction hole by a negative pressure within the suction table.

3. The manufacturing method of claim 1, wherein the manufacturing method further comprises:
   vibrating the suction table for leveling of the melted resin after immersing the at least one lighting source within the resin.

4. The manufacturing method of claim 1, wherein resin is made of transparent material.

5. The manufacturing method of claim 1, wherein the resin is formed by UV (Ultraviolet) resin.

6. The manufacturing method of claim 5, wherein the hardening the resin is executed by passing through a UV hardening device.

7. The manufacturing method of claim 1, wherein a lighting surface is formed to a side of the at least one lighting source.

8. The manufacturing method of claim 1,
   wherein the at least one lighting source is plural, and
   wherein the plurality of lighting sources includes a first lighting source and a second lighting source of which each lighting surface faces each other.

9. The manufacturing method of claim 1, wherein the at least one lighting source is a LED (Light Emitting Diode).

* * * * *